US010658297B2

(12) United States Patent
Redaelli et al.

(10) Patent No.: US 10,658,297 B2
(45) Date of Patent: May 19, 2020

(54) METAL-NITRIDE-FREE VIA IN STACKED MEMORY

(71) Applicant: Intel Corporation, Santa Clara, CA (US)

(72) Inventors: Andrea Redaelli, Casatenovo (IT); D. Ross Economy, Boise, ID (US); Mihir Bohra, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 144 days.

(21) Appl. No.: 16/024,834

(22) Filed: Jun. 30, 2018

(65) Prior Publication Data

US 2019/0043807 A1 Feb. 7, 2019

(51) Int. Cl.
| H01L 47/00 | (2006.01) |
| H01L 23/48 | (2006.01) |
| H01L 21/4763 | (2006.01) |
| H01L 21/44 | (2006.01) |
| H01L 23/532 | (2006.01) |
| G11C 8/14 | (2006.01) |
| H01L 21/3205 | (2006.01) |
| H01L 23/522 | (2006.01) |
| G11C 7/18 | (2006.01) |
| H01L 27/24 | (2006.01) |

(52) U.S. Cl.
CPC ............ *H01L 23/5329* (2013.01); *G11C 7/18* (2013.01); *G11C 8/14* (2013.01); *H01L 21/32053* (2013.01); *H01L 23/5226* (2013.01); *H01L 23/53209* (2013.01); *H01L 27/24* (2013.01); *H01L 27/2481* (2013.01)

(58) Field of Classification Search
CPC ....... G11C 7/18; G11C 8/14; H01L 21/32053; H01L 23/5226; H01L 23/53209; H01L 27/24
See application file for complete search history.

(56) References Cited

U.S. PATENT DOCUMENTS

| 8,541,768 B2 * | 9/2013 | Shima ................ H01L 27/2409 257/2 |
| 8,546,780 B2 * | 10/2013 | Iijima ................ H01L 27/2409 257/2 |
| 9,754,667 B2 | 9/2017 | Alsmeier | 
| 9,991,315 B2 * | 6/2018 | Terai .................. H01L 27/2427 |
(Continued)

FOREIGN PATENT DOCUMENTS

WO 2019009876 A1 1/2019

OTHER PUBLICATIONS

International Search Report and Written Opinion for PCT Patent Application No. PCT/US2017/040555, dated Mar. 15, 2018, 9 pages.

*Primary Examiner* — Alonzo Chambliss
(74) *Attorney, Agent, or Firm* — Compass IP Law PC

(57) ABSTRACT

A nonvolatile memory device includes a metal silicon nitride layer on a three-dimensional (3D) crosspoint architecture, where the metal silicon nitride layer is in the memory array processing. The metal silicon nitride layer is patterned in accordance with the memory array structure, rather than being an underlying layer for a metal layer. The metal layer provides bitline or wordline select paths, and can connect to a via in parallel with the memory array stack. The metal silicon nitride layer is between the metal layer and the memory array, and is not present over the via.

20 Claims, 9 Drawing Sheets

(56) References Cited

U.S. PATENT DOCUMENTS

| | | |
|---|---|---|
| 2005/0002227 A1 | 1/2005 | Hideki et al. |
| 2008/0068879 A1 | 3/2008 | Ahn et al. |
| 2008/0078984 A1 | 4/2008 | Park et al. |
| 2009/0121208 A1* | 5/2009 | Nagashima ............ H01L 27/101 257/2 |
| 2009/0137112 A1* | 5/2009 | Tabata ................ H01L 27/2409 438/631 |
| 2011/0193048 A1 | 8/2011 | Oh et al. |
| 2012/0091414 A1* | 4/2012 | Iwakaji ............. H01L 21/02425 257/2 |
| 2017/0287833 A1 | 10/2017 | Thimmegowda et al. |
| 2018/0144977 A1 | 5/2018 | Yu et al. |

\* cited by examiner

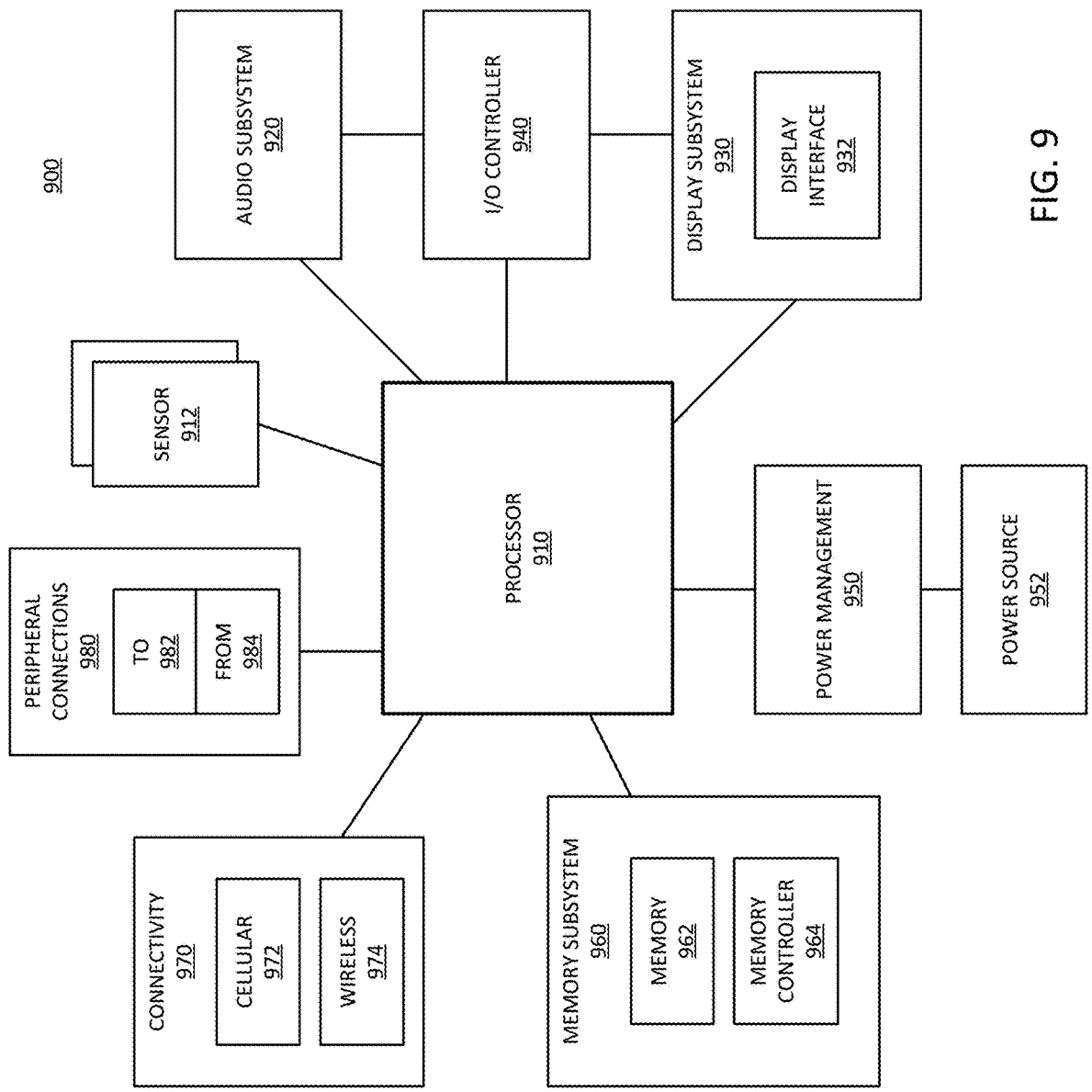

METAL-NITRIDE-FREE VIA IN STACKED MEMORY

FIELD

Descriptions are generally related to stacked memory devices, and more particular descriptions are related to a stacked memory with a metal-nitride-free via.

BACKGROUND

Many emerging memory devices use an application of three dimensional device stacking, where the memory cells are created on the semiconductor substrate in three dimensions instead of only two dimensions in a plane. The memory structure typically includes a metal layer above the memory array to provide the connecting lines for the circuit, such as bitline connections or wordline connections. The structures often employ vias that reach down to circuit features associated with driving the memory array. Typically the vias are formed with chemical vapor deposition (CVD) to form metal in a vertical structure.

Reducing the number of processing steps typically improves cost and process flow. However, reducing the number of processing steps can require tradeoffs between the benefits and unintended effects of certain architectural choices. For example, the inclusion of tungsten silicon nitride in the circuit can provide reset current (Ireset) improvement for certain memory cells, but the resistivity of the tungsten silicon nitride increases losses to current flow in the via.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

FIG. 9 is a block diagram of an example of a mobile device in which a memory system with a memory device with nitride-free vias can be implemented.

Figure 1:
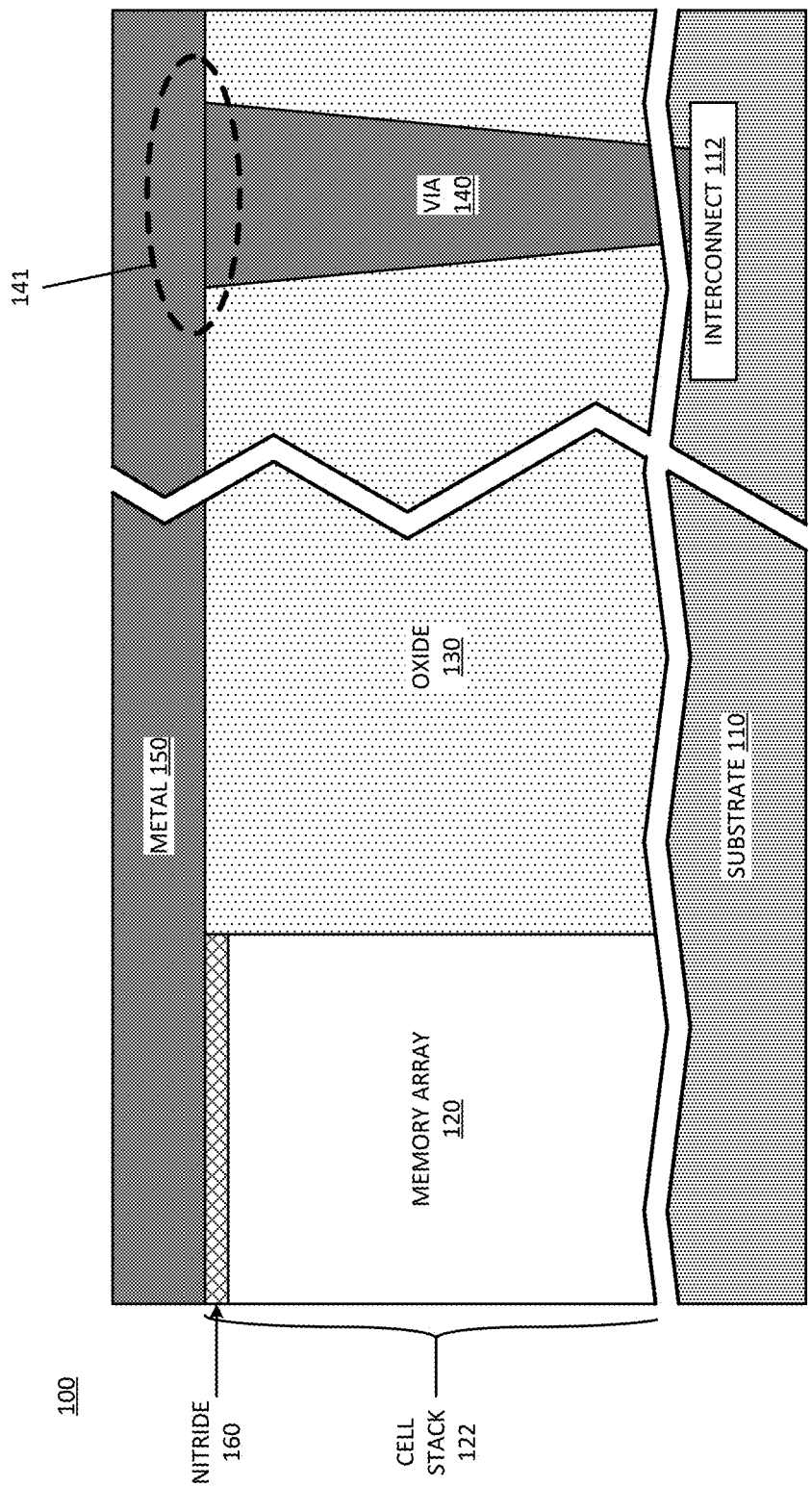
FIG. 1 is a block diagram of an example of a memory circuit without a metal silicon nitride layer over a via.

Descriptions of certain details and implementations follow, including non-limiting descriptions of the figures, which may depict some or all examples, and well as other potential implementations.

DETAILED DESCRIPTION

As described herein, a nonvolatile memory device includes a metal silicon nitride layer on a three-dimensional (3D) crosspoint architecture, where the metal silicon nitride layer is in the memory array processing. The metal silicon nitride layer is patterned in accordance with the memory array structure, rather than being an underlying layer for a metal layer. The metal silicon nitride layer is over connectors or top electrodes of the memory array between the metal layer and the memory array pillars, and is absent from vias that connect with top connectors or top electrodes to underlying circuitry. The metal layer provides bitline or wordline select paths, and can connect to the vias, which are in parallel with the memory array stack.

Certain examples below specifically refer to implementation with tungsten (W) as a metal, but those descriptions are to be understood only as examples. Other metals can be used. As described herein, metal silicon nitride, such as tungsten silicon nitride (WSiN) can be deposited as part of a memory circuit to provide desired reset current response behavior, but can be removed from the top of the vias. Including the metal silicon nitride on the memory array, and removing it from the vias can improve the current delivery to the memory cells. In one example, the memory cells are three dimensional (3D) memory cells, such as nonvolatile 3D crosspoint (3DXP) memory cells.

In one example, the metal silicon nitride is implemented in between 3D crosspoint cell films and metal for the wordline (WL) or bitline (BL). In the tungsten example, WSiN is more resistive (approximately 1-1000 mΩ-cm) relative to tungsten, which will limit current delivery when present at the top of CVD (chemical vapor deposition) filled vias. The resistivity of WSiN is approximately six orders of magnitude higher than that of W ($\times 10^6$).

While tungsten (W) is described throughout as an example of the metal, tungsten is only one example. Other metals that could be used include, but are not limited to, refractory metals such as tantalum (Ta), molybdenum (Mo), and niobium (Nb). Depending on the definition used, refractory metals can include W, Ta, Mo, and Nb, as well as titanium (Ti), vanadium (V), chromium (Cr), and zirconium (Zr). There are other metals that can be considered refractory metals, but are not as commonly used. Examples of metal silicon nitrides can include a semiconductor and nitride, such as, but not limited to: titanium silicon nitride (TiSiN), tantalum silicon nitride (TaSiN), and others.

In one example, the memory circuit can include a silicide seed layer for the metal. For example, in a system using tungsten metal, the circuit can include a WSix seed layer. The notation "WSix" includes reference to the "W" for the chemical notation for tungsten, the "Si" for the chemical notation for silicon, and the "x" referring to a ratio of silicon to tungsten. The ratio can be an integer such as 1, 2, 3, or so forth, or can be a non-integer such as 1.25, 1.5, 1.67, 2.5, or other integer. Common chemical compounds for semiconductor processes have ratios of approximately 0.25 to 5, although certain chemical compounds could fall outside that range. Consider an example where "x" can be a number such as 2, referring to $WSi_2$, referring to a ratio of two silicon atoms per tungsten atom, such as $WSi_2$, $W_2Si_4$, or others. Alternative metal silicides can include, but are not limited to: $WSi_3$, $WSi_4$, $TiSi_2$ (titanium silicide), $TaSi_2$ (tantalum silicide), or others. A WSix seed layer or other relevant seed layer can provide lower WL/BL resistivity for device performance and increased tensile strength for structural yield. Tungsten silicide is provided as an example throughout, but it will be understood that different silicides could be used. It will be understood that different metal silicides would have correspondingly different chemical notations In one example, the metal silicon nitride is included into the memory cell processing to remove it from the metal routing path for the memory device. The inclusion of the nitride in the memory array processing to ensure removal of the nitride from the vias provides a relatively low cost approach compared to other methods of trying to prevent the presence of nitride between the metal layer and the via. In one example, the nitride layer is included within the fully patterned crosspoint of the memory cells, instead of being patterned with the WL or BL. The process can be referred to as relocating the metal silicon nitride into the memory cell stack.

FIG. 1 is a block diagram of an example of a memory circuit without a metal silicon nitride layer over a via. Circuit 100 includes elements of a stacked memory device. Circuit 100 includes substrate 110, which represents a semiconductor material on which the memory circuit can be formed. Circuit 100 includes memory array 120 formed on substrate 110. Memory array 120 is or includes a stack of memory cells, as indicated by cell stack 122. Cell stack 122 represents the three dimensional nature of the memory array structure, which includes stacked elements instead of simply building all memory cell elements in two dimensions on the surface of substrate 110.

Cell stack 122 can refer to the fact that the memory cells are formed by stacking or layering multiple elements one on top of each other to create memory cell components that are vertical with respect to the surface of substrate 110. Circuit 100 includes oxide 130 as an insulator that separates memory array 120 from via 140. The break in circuit 100 is intended to indicate that there may be space between the circuit elements that is not shown. It will be understood that the elements in circuit 100 are not necessarily drawn to scale. In one example, circuit 100 includes nitride 160 as a layer on memory array 120, which is either not formed on, or is removed from, via 140. Area 142 illustrates a direct connection between metal 150 and via 140, instead of having a portion of nitride 160 between metal 150 and via 140.

Substrate 110 can include interconnect 112 to couple metal 150 to one or more components of memory array 120. In one example, interconnect 112 represents a copper layer that completes a connection of the select line (e.g., the BL or WL). Metal 150 represents a metal contact layer, which can provide connection to a select specific memory elements or memory cells of memory array 120. Via 140 provides an electrical path from metal 150 to interconnect 112 or other circuitry on substrate 110. In one example, metal 150 represents a wordline. In one example, metal 150 represents a bitline. It will be understood that in a memory cell stack, there could be other layers or other portions of the memory stack. For example, if metal 150 represents the bitline, an additional, similar stack can represent a portion of the memory stack structure that includes a connection to the wordline.

The inclusion of nitride 160 can provide current benefit for selection of memory cells of memory array 120. The lack of nitride between metal 150 and via 140 can provide additional current benefit. A traditional memory circuit can be considered to have two different patterning sequences in the circuit processing, where the patterning provides for the 3D structures. The patterning sequences can be thought of as a "first cut" and a "second cut". The first cut refers to the patterning in the wordline direction from the top electrode down through the wordline. The bitline can be deposited after the first cut. The second cut can then refer to the patterning in the bitline direction, and will pattern perpendicularly from the top of the bitline and stop of the top of the wordline in the bottom electrode. Circuit 100 can relocate the metal silicon nitride that traditionally is present in the second cut of the WL/BL stack to within the first cut at the top of memory cell stack 122.

The presence of metal silicon nitride 160 on memory array 120 and not on via 140 can be lower cost than other processing options at least because of the ability to integrate the patterning into existing sequences. For example, the patterning of nitride 160 on cell stack 122 would not require additional photo or lithography levels, and would not require reconfiguring deposition tools. Experience has shown the inventors that there is not a true thickness requirement for WSiN in a circuit using tungsten metal. Rather, the mere presence of the WSiN appears to be enough to provide the current benefit to the memory cell stack. Thus, in one example, nitride 160 can provide flexibility for use as a stopping layer for nitride CMP (chemical mechanical polishing). A thin WSiN film does not heavily impact a dry etch performance.

It will be appreciated that processing operations can result in the presence of artifacts or processing artifacts in the circuit. For example, CMP results in either the presence of some remaining materials that is intended to be removed, which has essentially been polished into the layer being polished. Alternatively, the artifact can be a thinning of the polished layer and especially the mixing of material at barriers. For example, CMP can result in mixing of metal and oxide at the boundary of via 140 with oxide 130.

In contrast to a traditional circuit processing approach, circuit 100 will include nitride 160 on memory array 120, and not on via 140. Nitride 160 would not be a continuous film beneath metal 150, but can be present at the top of cell stack 122 in the crosspoint structure. Thus, for example, nitride 160 can be cross-hatched, having space between memory cell stack pillars in both x and y directions of a plane relative to the surface of substrate 110. When included as a continuous film beneath metal 150, nitride 160 would have space in either the x or y direction, but would extend for a significant portion or the entire memory array 120.

Nitride 160 can be detected in finished circuit 100 through a cross-section analysis, such as what is performed with a transmission electron microscope (TEM) or Electron Energy Loss Spectroscopy (EELS). The layers remain in the completed circuit, which provides the performance improvements over circuits that do not include the same structures described.

Figure 2:
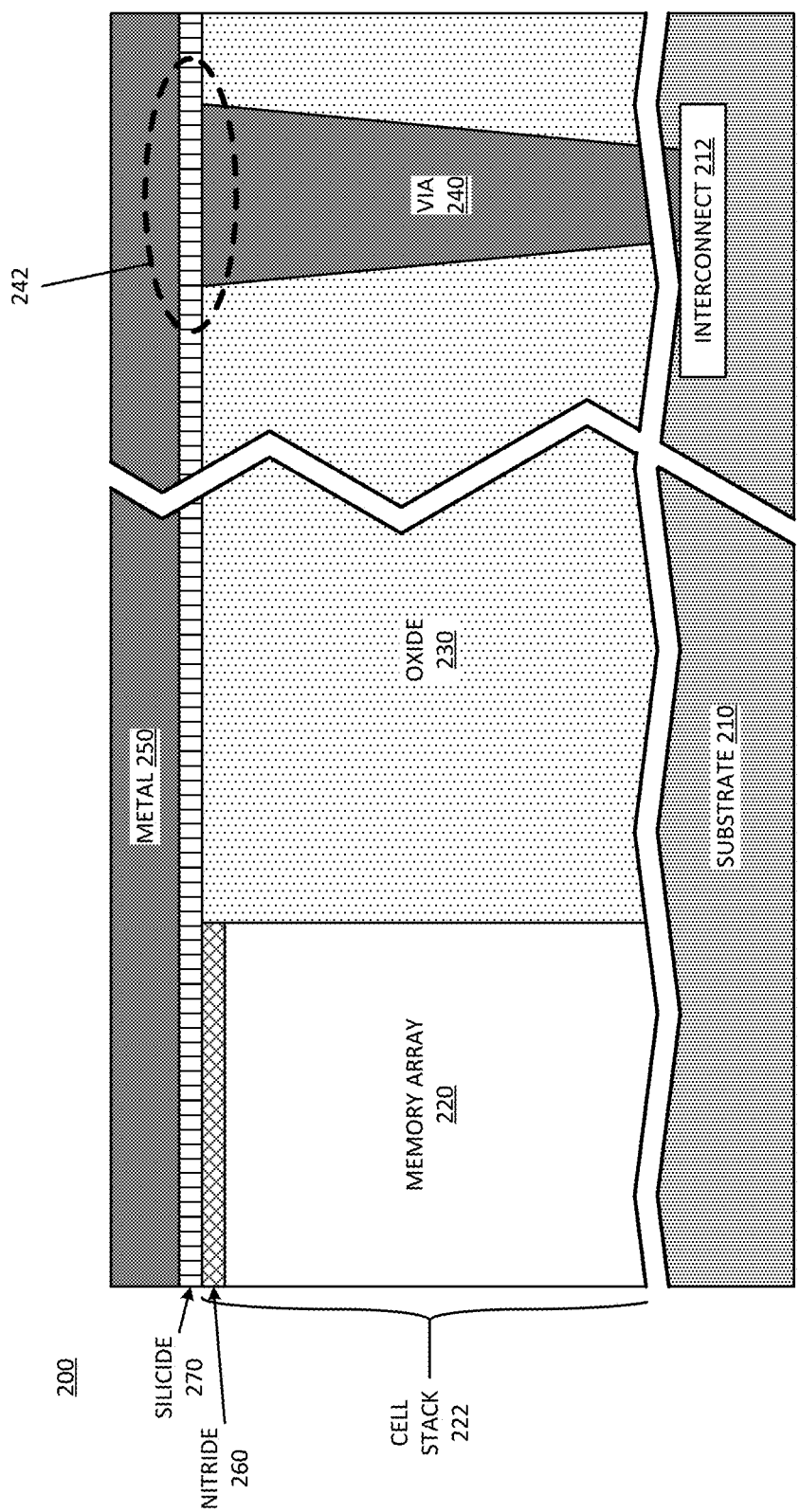
FIG. 2 is a block diagram of an example of a memory circuit without a metal silicon nitride layer over a via, and with a metal silicide seed layer.

FIG. 2 is a block diagram of an example of a memory circuit without a metal silicon nitride layer over a via, and with a metal silicide seed layer. Circuit 200 includes elements of a stacked memory device, and can be one example of a circuit in accordance with circuit 100, with the addition of a silicide seed layer for the metal layer. Circuit 200 includes substrate 210, which represents a semiconductor material on which the memory circuit can be formed. Circuit 200 includes memory array 220 formed on substrate 210. Memory array 220 is or includes a stack of memory cells, as indicated by cell stack 222. Cell stack 222 represents the 2D memory array structure of memory array 220, with stacked elements.

Cell stack 222 can refer to the fact that the memory cells are formed by stacking or layering multiple elements one on top of each other to create memory cell components that are vertical with respect to the surface of substrate 210. Circuit 200 includes oxide 230 as an insulator that separates memory array 220 from via 240. The break in circuit 200 can indicate that there may be space between the circuit elements that is not shown. It will be understood that the elements in circuit 200 are not necessarily drawn to scale.

In one example, circuit 200 includes nitride 260 as a layer on memory array 220, which is either not formed on, or is removed from, via 240. In one example, integration of nitride 260 into cell stack 222 allows for removal of the nitride from the top of via 240. Area 242 illustrates a connection between metal 250 and via 240, without a layer of nitride 260 between metal 250 and via 240. Substrate 210 can include interconnect 212 to couple metal 250 to one or more components of memory array 220. In one example, interconnect 212 represents a copper layer that completes a connection of the select line (e.g., the BL or WL). Metal 250 represents a metal contact layer, which can provide connection to a select specific memory elements or memory cells of memory array 220. Via 240 provides an electrical path from metal 250 to interconnect 212 or other circuitry on substrate 210. In one example, metal 250 represents a wordline. In one example, metal 250 represents a bitline. It will be understood that in a memory cell stack, there could be other layers or other portions of the memory stack. For example, if metal 250 represents the bitline, an additional, similar stack can represent a portion of the memory stack structure that includes a connection to the wordline.

The inclusion of nitride 260 can benefit the current flow for selection of memory cells of memory array 220. The lack of nitride between metal 250 and via 240 can provide additional current benefits because of the higher resistivity of nitride 260 relative to metal 250. In one example, circuit 200 can be considered to be processed with first cut and second cut patterning sequences. Circuit 200 can relocate the metal silicon nitride that traditionally is present in the second cut of the WL/BL stack to within the first cut at the top of memory cell stack 222.

Circuit 200 can include CMP artifacts, and can include circuit structure features detectable in the final circuit structure as with circuit 200. In contrast to a traditional circuit processing approach, circuit 200 will include nitride 260 on memory array 220, and not on via 240. Nitride 260 would not be a continuous film beneath metal 250, but can be present at the top of cell stack 222 in the crosspoint structure.

In one example, circuit 200 includes silicide layer 270. Silicide 270 can provide a seed layer for metal 250. Silicide 270 can be or include an amorphous metal silicide. Silicide 270 allows metal 250 to structure well. In an example with tungsten metal, silicide 270 represents $WSi_x$, which can result in better structure of the W of metal 250, resulting in larger grain size.

At area 242, it can be observed that while there is no nitride between metal 250 and via 240, there is a layer of silicide. However, it will be understood that the resistivity of the silicide is comparable to the metal itself, as contrasted to the increased resistivity of the nitride. Additionally given the benefits to the grain size of metal 250, silicide 270 can lower the resistivity of the current path or improving current delivery, while also increasing stress capability of the circuit, such as improving line bending for circuit 200.

Figure 3:
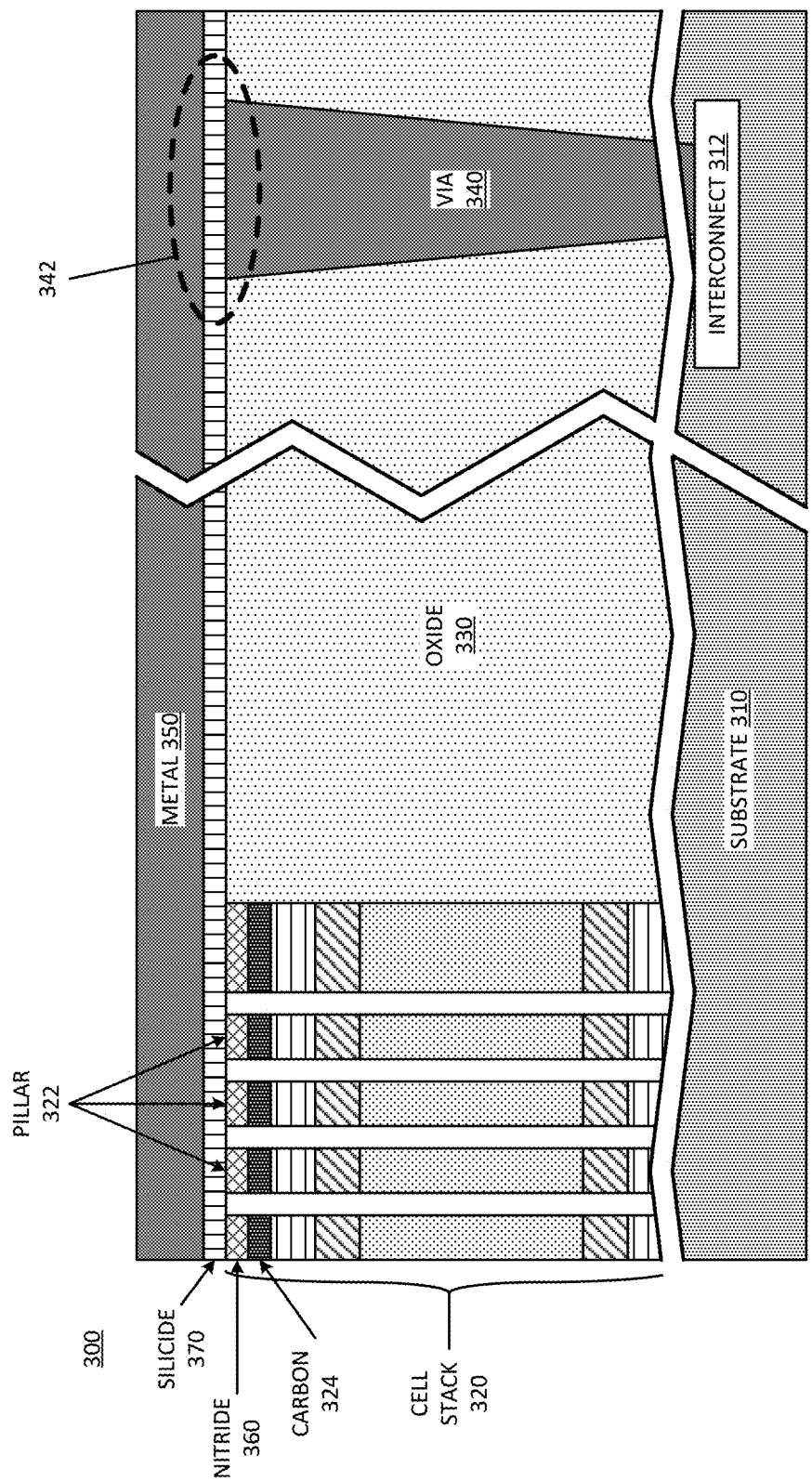
FIG. 3 is a block diagram of an example of a memory circuit with metal silicon nitride layer over the memory structure and not over the via.

FIG. 3 is a block diagram of an example of a memory circuit with metal silicon nitride layer over the memory structure and not over the via. Circuit 300 includes elements of a stacked memory device, and can be one example of a circuit in accordance with circuit 100, or a circuit in accordance with circuit 200. Circuit 300 includes a silicide layer as well as a carbon layer. Circuit 300 includes substrate 310, which represents a semiconductor material on which the memory circuit can be formed. Circuit 300 includes memory cell stack 320, which represents memory cells of a memory array. Cell stack 322 represents the 3D memory array structure with stacked elements. Circuit 300 represents cell stack 320 as multiple pillars 322 electrically separated from each other. Pillars 322 can represent a selectable memory cell or stack of memory cells.

Cell stack 322 illustrates different layers of memory cells. The layering illustrated is merely illustrative of the fact that the memory cells are formed by layers of material, and is not limiting in terms of how many layers, or the type of materials used to form the stack. Different shading and cross-hatching represents that materials can be different from each other. Different areas of shading or cross-hatching can represent multiple elements layered together, and thus do not necessarily represent separate layers of different material. Circuit 300 includes oxide 330 to separate cell stack 320 from via 340. The break in circuit 300 can indicate that there may be space between the circuit elements that is not shown. It will be understood that the elements in circuit 300 are not necessarily drawn to scale.

In one example, circuit 300 includes nitride 360 as a layer on cell stack 320, which is either not formed on, or is removed from, via 340. In one example, integration of nitride 360 into cell stack 320 allows for removal of the nitride from the top of via 340. Area 342 illustrates a connection between metal 350 and via 340 without nitride 360 between the metal and via. Substrate 310 can include interconnect 312 to couple metal 350 to one or more components of cell stack 320. In one example, interconnect 312 represents a copper layer that completes a connection of the select line (e.g., the BL or WL). Metal 350 represents a metal contact layer, which can provide connection to a select specific memory elements or memory cells of cell stack 320. Via 340 provides an electrical path from metal 350 to interconnect 312 or other circuitry on substrate 310. In one example, metal 350 represents a wordline. In one example, metal 350 represents a bitline. It will be understood that in a memory cell stack, there could be other layers or other portions of the memory stack. For example, if metal 350 represents the bitline, an additional, similar stack can represent a portion of the memory stack structure that includes a connection to the wordline.

The inclusion of nitride 360 can provide current benefit for selection of memory cells of cell stack 320. The lack of nitride between metal 350 and via 340 can provide additional current benefit because of the higher resistivity of nitride 360 relative to metal 350. In one example, circuit 300 can be processed with first cut and second cut patterning sequences. Circuit 300 can relocate the metal silicon nitride that traditionally is present in the second cut of the WL/BL stack to within the first cut at the top of memory cell stack 320.

The presence of metal silicon nitride 360 on cell stack 320 and not on via 340 can be lower cost than other processing options, similar to what is described above with respect to circuit 100. Circuit 300 can likewise include CMP artifacts, and can include circuit structure features detectable in the final circuit structure as with circuit 100. In contrast to a traditional circuit processing approach, circuit 300 will include nitride 360 on cell stack 320, and not on via 340. Nitride 360 would not be a continuous film beneath metal 350, but can be present at the top of cell stack 322 in the crosspoint structure. As illustrated, as part of the crosspoint structure, nitride 360 has gaps instead of being continuous below metal 350.

In one example, circuit 300 includes silicide layer 370. Silicide 370 can provide a seed layer for metal 350. Silicide 370 can be or include an amorphous metal silicide. Silicide 370 allows metal 350 to structure well. Silicide 370 can provide higher tensile stress for structural benefits to circuit 300, as well as improving current delivery of the system. At area 342, it can be observed that while there is no nitride between metal 350 and via 340, there is a layer of silicide.

In one example, circuit 300 includes a carbon layer on the memory cells, as illustrated by carbon 324 on cells stack 320. Carbon 324 may be referred to as a top electrode (TE) layer. In one example, carbon 324 interfaces directly or directly contacts nitride 360. As provided in circuit 300 with nitride 360 within the memory array, circuit 300 can maintain the interface between carbon 324 and nitride 360 (for example, a TE-WSiN interface), but allow for removal of nitride 360 outside of the memory array. Removal outside the array will remove the nitride from the top of via 340, as described. Carbon 324 can provide a desired thermal barrier and desired electrical device performance while still allowing for high current delivery to memory cells.

It will be understood that circuit 300 can be part of an integrated circuit (I/C) chip, such as a memory chip. The memory chip can couple to a processor. The processor can be part of a host system, or can be part of a memory circuit, such as a controller within a solid state memory device.

Figure 4:
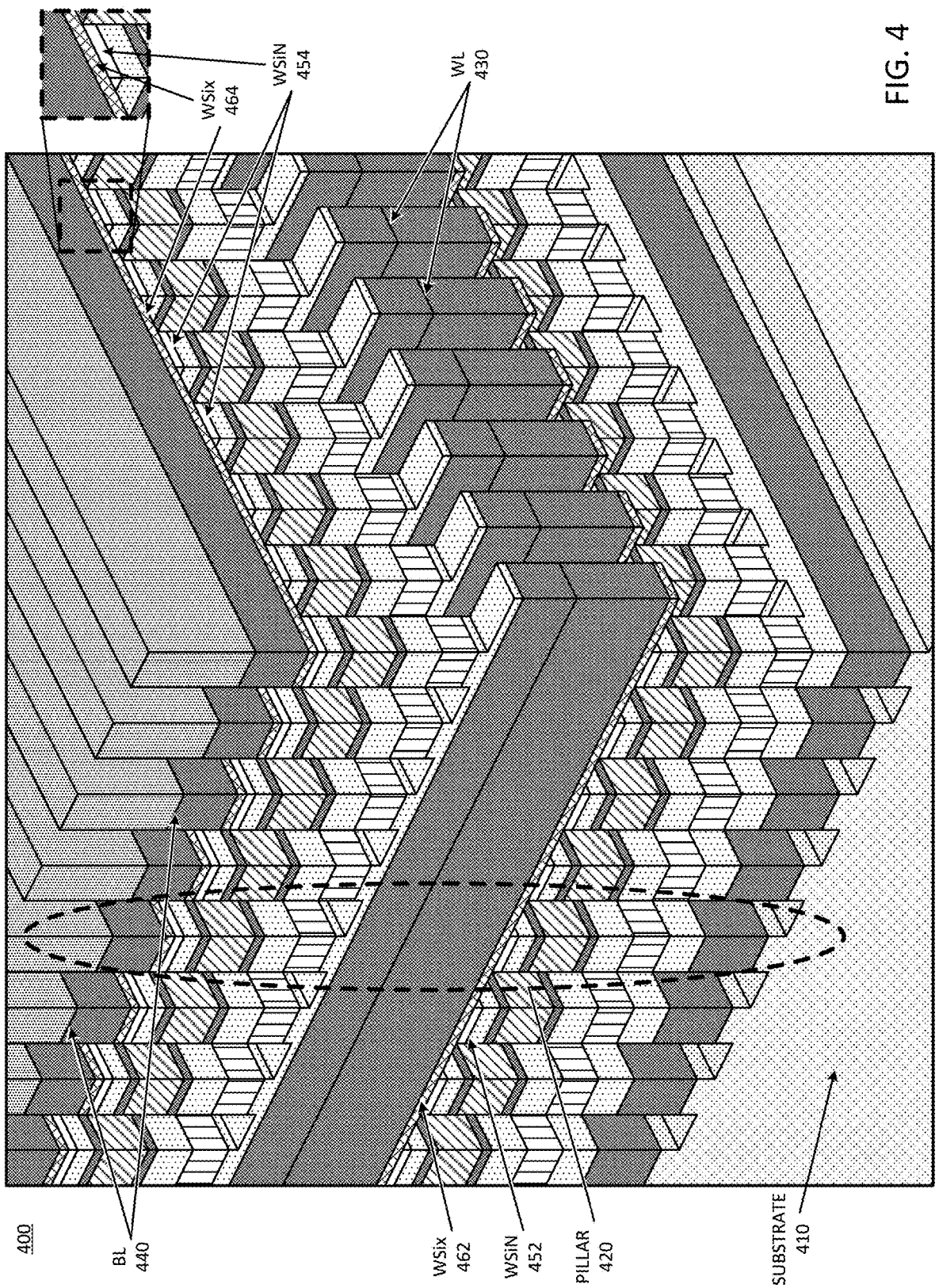
FIG. 4 is a perspective diagram of an example of a memory circuit with metal silicon nitride layer over the memory structure and not over the via.

FIG. 4 is a perspective diagram of an example of a memory circuit with metal silicon nitride layer over the memory structure and not over the via. Circuit 400 provides an example of a circuit in accordance with circuit 100, or circuit 200, or circuit 300. The specific layers are merely examples, and will not be described in detail here. Circuit 400 illustrates the use of silicide and nitride in accordance with what is described previously.

Circuit 400 is built on substrate 410, such as silicon or other semiconductor. Circuit 400 includes multiple pillars 420 as memory cell stacks. In the diagram of circuit 400, it will be observed that the wordlines and bitlines are orthogonal to each other, and traverse or cross each other in a cross-hatch pattern. A crosspoint memory structure includes at least one memory cell in a stack between layers of bitline and wordline. As illustrated, wordlines (WL) 430 are in between layers of elements, and bitlines (BL) 440 are located at the top of the circuit. Such a configuration is only an example, and the bitline and wordline structure can be swapped. Thus, in one representation of circuit 400, the wordlines can be the metal structures labeled as 440, and the bitlines can be the metal structures labeled as 430. More generically, wordlines and bitlines can be referred to as "access lines", referring to signal lines used to address memory cells. Different architectures can use different numbers of stacks of devices, and different configuration of wordlines and bitlines. In one example, the WSiN is between each pillar 420 and the WL/BL, but is not in the gaps between pillars. It will be understood that the space between pillars 420 is typically an insulator. In one example, the WSiN is not over the insulator. In an alternative implementation, the WSiN is over the insulator between pillars but is not over the vias.

In one example, circuit 400 the bitline and wordline are made of tungsten metal. In one example, circuit 400 includes WSiN between the memory cell stacks and the wordline or bitline, or both. For example, circuit 400 includes WSiN 452 between the memory cell structure and WL 430. As another example, circuit 400 includes WSiN 454 between the memory cell structure and BL 440. In one example, circuit 400 includes both WSiN 452 and WSiN 454. In one example, the tungsten silicon nitride is patterned with the memory cells of pillars 420. Such processing can result in a connection between the WSiN and the BL/WL tungsten on top, without obstruction on a via (not specifically shown in circuit 400). The via can go to a copper layer that completes a connection for the WL/BL. In one example, pillars 420 include carbon on top of the memory cell structures in addition to WSiN.

In one example, circuit 400 includes WSix as a seed layer for the metal of the WL or the BL, or both. For example, circuit 400 includes WSix 462 between the memory cell structure and WL 430. As another example, circuit 400 includes WSix 464 between the memory cell structure and BL 440. Instead of being patterned with the memory cell structure of pillars 420, the WSix is patterned with the metal of the bitline or the wordline.

Figure 5:
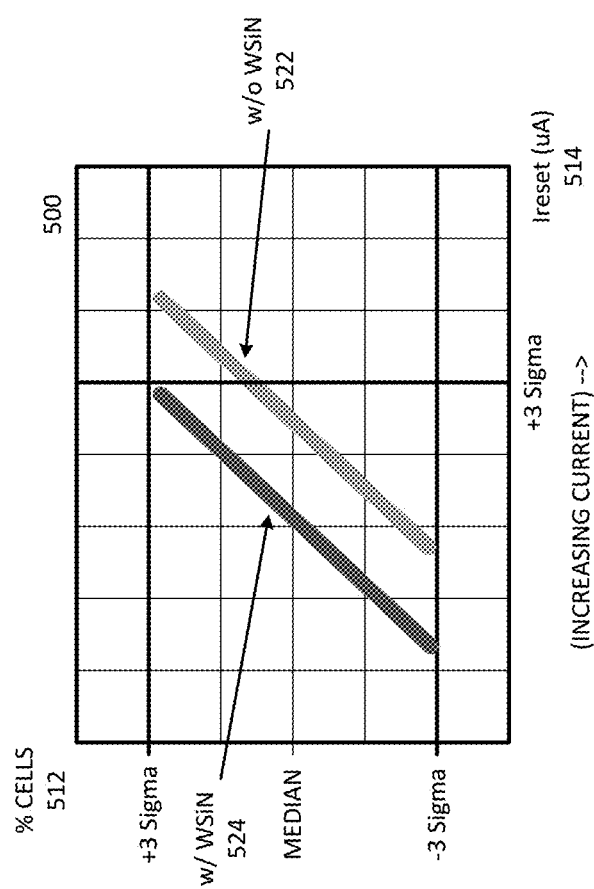
FIG. 5 is a representation of an example of a diagram to show different current response based on the presence of tungsten silicon nitride.

FIG. 5 is a representation of an example of a diagram to show different current response based on the presence of tungsten silicon nitride. Diagram 500 provides a representation of the difference in reset current performance with and without WSiN. It will be understood that the lines are only representative, and a plot for a measured or simulated system would have a line that is not a straight line.

The diagram illustrates the percentage of cells that trigger reset versus the (reset current. Axis 512 represents the percentage of cells, from 3 standard deviations below a median point (−3 sigma) to 3 standard deviations above the median point (+3 sigma). Axis 514 represents increasing current moving from left to right on the page.

There is a certain reset current ((reset) that will trigger reset of the memory cell, until the increased current triggers a threshold number of cells. The target is to trigger +3 sigma percentage of cells within a three standard deviation increase in current. Line 522 shows performance for the memory circuit without WSiN, and line 524 shows performance for the memory circuit with WSiN. Line 522 does not achieve the desired performance, while line 524 shows the desired performance.

Figure 6:
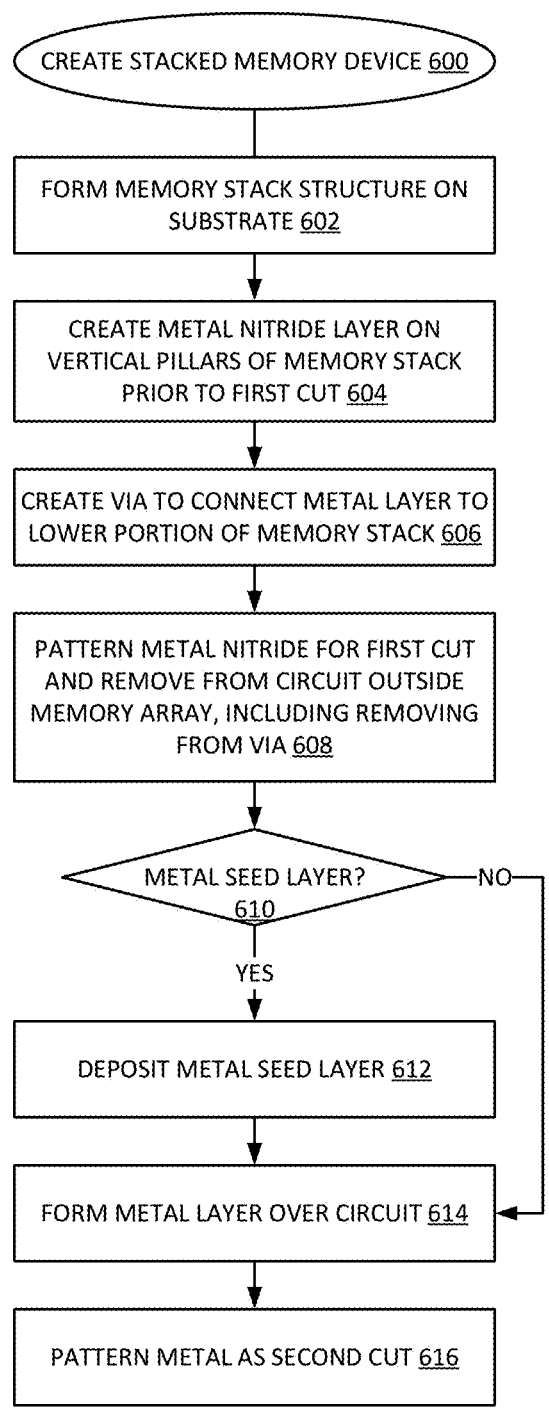
FIG. 6 is a flow diagram of an example of a process for creating a memory stack circuit device.

FIG. 6 is a flow diagram of an example of a process for creating a memory stack circuit device. Process 600 provides an example of a process to create a stacked memory device. In one example, the process forms a memory stack structure on a substrate, 602. The memory stack structure can be a portion of the stacked memory circuit that connects to a bitline or the portion that connects to a wordline. In one example, the process for connecting to either the bitline or wordline is similar or the same. In one example, the memory stack structure includes a carbon layer.

The process creates a metal silicon nitride layer on vertical pillars of the memory stack prior to a first cut, 604. In one example, the process creates a via to connect the metal layer to a lower portion of the memory stack circuit, 606. For example, the via can connect to a metal layer than completes the connection.

In one example, the process patterns the metal silicon nitride with the first cut and removes the nitride from the circuit outside the memory array, including the metal silicon nitride from the via, 608. In one example, removing the nitride includes performing a CMP process.

In one example, the circuit also uses a metal seed layer. If the circuit uses a metal seed layer, 610 YES branch, the process deposits the metal seed layer, 612. The process can then form the metal layer over the circuit, 614. If the circuit does not include a metal seed layer, 610 NO branch, the process forms the metal layer over the circuit, 614, without first depositing a seed layer. The process can pattern the metal as a second cut, 616.

Figure 7:
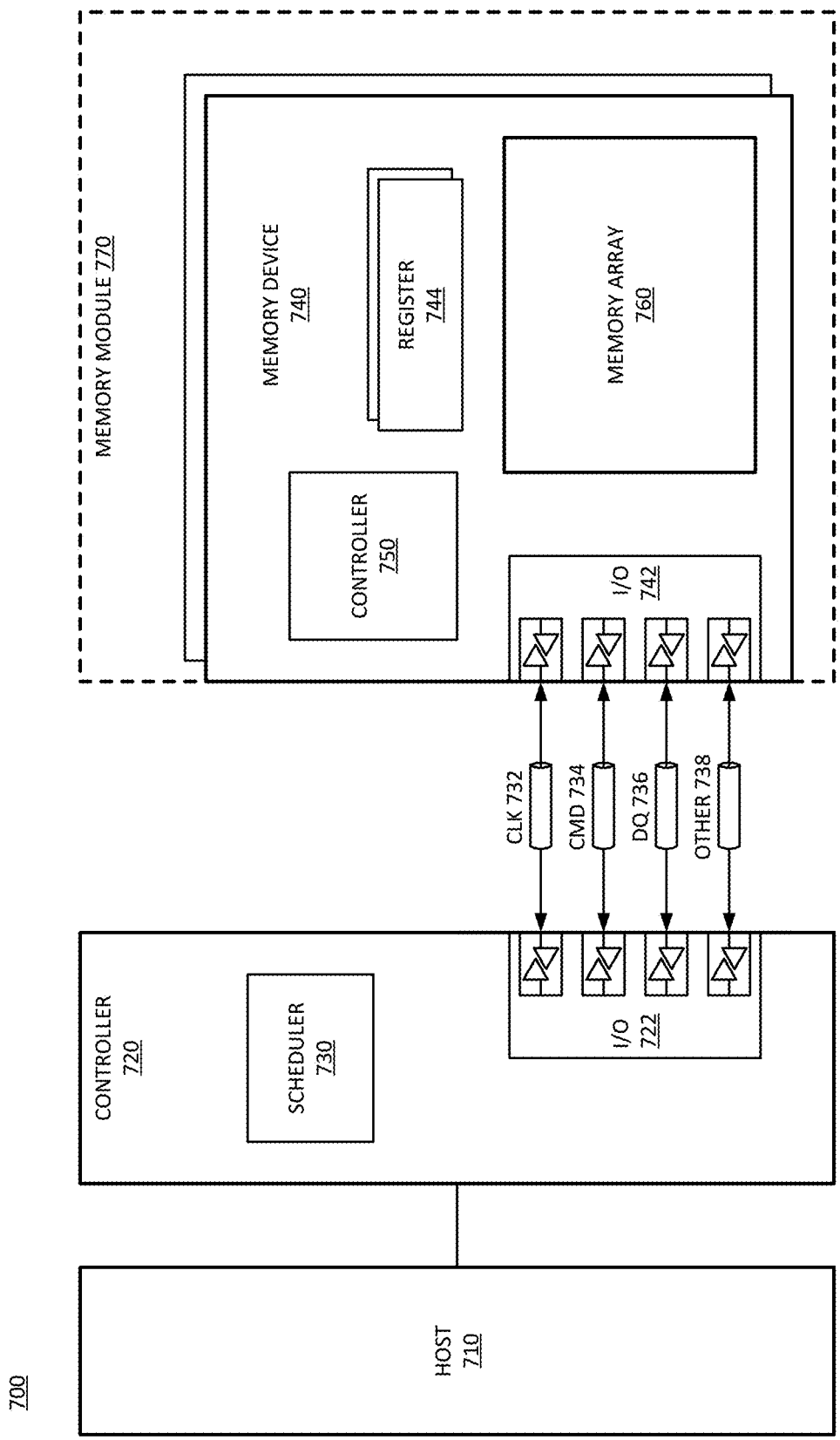
FIG. 7 is a block diagram of an example of a memory subsystem in which a memory device with nitride-free vias can be implemented.

FIG. 7 is a block diagram of an example of a memory subsystem in which a memory device with nitride-free vias can be implemented. System 700 includes a processor and elements of a memory subsystem in a computing device. The memory devices can be in accordance with an example of circuit 100, circuit 200, circuit 300, or circuit 400.

In one example, memory array 760 includes stacked memory cells in accordance with any example provided herein. The stacked memory cell structure includes a metal silicon nitride layer on a memory cell structure. The metal silicon nitride layer is on the memory array and is patterned with the crosspoint architecture, and is not on vias that provide a connection from the wordline or bitline to other circuitry. In one example, the stacked memory cell structure includes a layer of metal silicide. In one example, memory device 740 represents a nonvolatile memory device. In such an example, memory module 770 can represent a nonvolatile DIMM module or a storage device such as a solid state storage device.

Hosts 710 can include a processing unit of a computing platform that may execute an operating system (OS) and applications, which can collectively be referred to as the host or the user of the memory. The OS and applications execute operations that result in memory accesses. Host 710 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 700 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, JESD79, initial specification published in September 2012 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (currently in discussion by JEDEC), HBM2 ((HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one example, a system with volatile memory that needs to be refreshed can also include nonvolatile memory.

Memory controller 720 represents one or more memory controller circuits or devices for system 700. Memory controller 720 represents control logic that generates memory access commands in response to the execution of operations by processor 710. Memory controller 720 accesses one or more memory devices 740. Memory devices 740 can be DRAM devices in accordance with any referred to above. In one example, memory devices 740 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 720 manages a separate memory channel, although system 700 can be configured to have multiple channels managed by a single controller, or to have multiple controllers on a single channel. In one example, memory controller 720 is part of host processor 710, such as logic implemented on the same die or implemented in the same package space as the processor.

Memory controller 720 includes I/O interface logic 722 to couple to a memory bus, such as a memory channel as referred to above. I/O interface logic 722 (as well as I/O interface logic 742 of memory device 740) can include pins, pads, connectors, signal lines, traces, or wires, or other hardware to connect the devices, or a combination of these. I/O interface logic 722 can include a hardware interface. As illustrated, I/O interface logic 722 includes at least drivers/transceivers for signal lines. Commonly, wires within an integrated circuit interface couple with a pad, pin, or connector to interface signal lines or traces or other wires between devices. I/O interface logic 722 can include drivers, receivers, transceivers, or termination, or other circuitry or combinations of circuitry to exchange signals on the signal lines between the devices. The exchange of signals includes at least one of transmit or receive. While shown as coupling I/O 722 from memory controller 720 to I/O 742 of memory device 740, it will be understood that in an implementation of system 700 where groups of memory devices 740 are accessed in parallel, multiple memory devices can include I/O interfaces to the same interface of memory controller 720. In an implementation of system 700 including one or more memory modules 770, I/O 742 can include interface hardware of the memory module in addition to interface hardware on the memory device itself. Other memory controllers 720 will include separate interfaces to other memory devices 740.

The bus between memory controller 720 and memory devices 740 can be implemented as multiple signal lines coupling memory controller 720 to memory devices 740. The bus may typically include at least clock (CLK) 732, command/address (CMD) 734, and write data (DQ) and read data (DQ) 736, and zero or more other signal lines 738. In one example, a bus or connection between memory controller 720 and memory can be referred to as a memory bus. The signal lines for CMD 734 can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 700 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 720 and memory devices 740. An example of a serial bus technology is 7B10B encoding and transmission of high-speed data with embedded clock over a single differential pair of signals in each direction. In one example, CMD 734 represents signal lines shared in parallel with multiple memory devices. In one example, multiple memory devices share encoding command signal lines of CMD 734, and each has a separate chip select (CS_n) signal line to select individual memory devices.

It will be understood that in the example of system 700, the bus between memory controller 720 and memory devices 740 includes a subsidiary command bus CMD 734 and a subsidiary bus to carry the write and read data, DQ 736. In one example, the data bus can include bidirectional lines for read data and for write/command data. In another example, the subsidiary bus DQ 736 can include unidirectional write signal lines for write and data from the host to memory, and can include unidirectional lines for read data from the memory to the host. In accordance with the chosen memory technology and system design, other signals 738 may accompany a bus or sub bus, such as strobe lines DQS (data strobe). Based on design of system 700, or implementation if a design supports multiple implementations, the data bus can have more or less bandwidth per memory device 740. For example, the data bus can support memory devices that have either a ×32 interface, a ×16 interface, a ×8 interface, or other interface. The convention "xW," where W is an integer that refers to an interface size or width of the interface of memory device 740, which represents a number of signal lines to exchange data with memory controller 720. The interface size of the memory devices is a controlling factor on how many memory devices can be used concurrently per channel in system 700 or coupled in parallel to the same signal lines. In one example, high bandwidth memory devices, wide interface devices, or stacked memory configurations, or combinations, can enable wider interfaces, such as a ×128 interface, a ×256 interface, a ×512 interface, a ×1024 interface, or other data bus interface width.

In one example, memory devices 740 and memory controller 720 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 740 can transfer data on each UI. Thus, a ×8 memory device operating on BL8 can transfer 64 bits of data (8 data signal lines times 8 data bits transferred per line over the burst). It will be understood that this simple example is merely an illustration and is not limiting.

Memory devices 740 represent memory resources for system 700. In one example, each memory device 740 is a separate memory die. In one example, each memory device 740 can interface with multiple (e.g., 2) channels per device or die. Each memory device 740 includes I/O interface logic 742, which has a bandwidth determined by the implementation of the device (e.g., ×16 or ×8 or some other interface bandwidth). I/O interface logic 742 enables the memory devices to interface with memory controller 720. I/O interface logic 742 can include a hardware interface, and can be in accordance with I/O 722 of memory controller, but at the memory device end. In one example, multiple memory devices 740 are connected in parallel to the same command and data buses. In another example, multiple memory devices 740 are connected in parallel to the same command bus, and are connected to different data buses. For example, system 700 can be configured with multiple memory devices 740 coupled in parallel, with each memory device responding to a command, and accessing memory resources 760 internal to each. For a Write operation, an individual memory device 740 can write a portion of the overall data word, and for a Read operation, an individual memory device 740 can fetch a portion of the overall data word. As non-limiting examples, a specific memory device can provide or receive, respectively, 8 bits of a 128-bit data word for a Read or Write transaction, or 8 bits or 16 bits (depending for a ×8 or a ×16 device) of a 256-bit data word. The remaining bits of the word will be provided or received by other memory devices in parallel.

In one example, memory devices 740 are disposed directly on a motherboard or host system platform (e.g., a PCB (printed circuit board) on which a processor of host 710 is disposed) of a computing device. In one example, memory devices 740 can be organized into memory modules 770. In one example, memory modules 770 represent dual inline memory modules (DIMMs). In one example, memory modules 770 represent other organization of multiple memory devices to share at least a portion of access or control circuitry, which can be a separate circuit, a separate device, or a separate board from the host system platform. Memory modules 770 can include multiple memory devices 740, and the memory modules can include support for multiple separate channels to the included memory devices disposed on them. In another example, memory devices 740 may be incorporated into the same package as memory controller 720, such as by techniques such as multi-chip-module (MCM), package-on-package, through-silicon via (TSV), or other techniques or combinations. Similarly, in one example, multiple memory devices 740 may be incorporated into memory modules 770, which themselves may be incorporated into the same package as memory controller 720. It will be appreciated that for these and other implementations, memory controller 720 may be part of host 710.

Memory devices 740 each include memory array 760. Memory array 760 represents memory locations or storage locations for data. Typically memory array 760 is managed as rows of data, accessed via wordline (rows) and bitline (individual bits within a row) control. Memory devices 740 can be organized as separate channels. Channels may refer to independent control paths to storage locations within memory devices 740.

In one example, memory devices 740 include one or more registers 744. Register 744 represents one or more storage devices or storage locations that provide configuration or settings for the operation of the memory device. In one example, register 744 can provide a storage location for memory device 740 to store data for access by memory controller 720 as part of a control or management operation. In one example, register 744 includes one or more Mode Registers. In one example, register 744 includes one or more multipurpose registers. The configuration of locations within register 744 can configure memory device 740 to operate in different "modes," where command information can trigger different operations within memory device 740 based on the mode. Additionally or in the alternative, different modes can also trigger different operation from address information or other signal lines depending on the mode. Settings of register 744 can indicate configuration for I/O settings (e.g., timing, termination or ODT (on-die termination), driver configuration, or other I/O settings).

Memory device 740 includes controller 750, which represents control logic within the memory device to control internal operations within the memory device. For example, controller 750 decodes commands sent by memory controller 720 and generates internal operations to execute or satisfy the commands. Controller 750 can be referred to as an internal controller, and is separate from memory controller 720 of the host. Controller 750 can determine what mode is selected based on register 744, and configure the internal execution of operations for access to memory resources 760 or other operations based on the selected mode. Controller 750 generates control signals to control the routing of bits within memory device 740 to provide a proper interface for the selected mode and direct a command to the proper memory locations or addresses. Controller 750 can decode command encoding received on command and address signal lines. Controller 750 can be or include a command decoder.

Referring again to memory controller 720, memory controller 720 can generate commands to send to memory devices 740. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 740, memory controller 720 can issue commands via I/O 722 to cause memory device 740 to execute the commands. In one example, controller 750 of memory device 740 receives and decodes command and address information received via I/O 742 from memory controller 720. Based on the received command and address information, controller 750 can control the timing of operations of the logic and circuitry within memory device 740 to execute the commands. Controller 750 is responsible for compliance with standards or specifications within memory device 740, such as timing and signaling requirements. Memory controller 720 can implement compliance with standards or specifications by access scheduling and control.

Memory controller 720 includes scheduler 730, which represents logic or circuitry to generate and order transactions to send to memory device 740. From one perspective, the primary function of memory controller 720 could be said to schedule memory access and other transactions to memory device 740. Such scheduling can include generating the transactions themselves to implement the requests for data by host 710. Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 720 typically includes logic such as scheduler 730 to allow selection and ordering of transactions to improve performance of system 700. Thus, memory controller 720 can select which of the outstanding transactions should be sent to memory device 740 in which order, which is typically achieved with logic much more complex that a simple first-in first-out algorithm. Memory controller 720 manages the transmission of the transactions to memory device 740, and manages the timing associated with the transaction. In one example, transactions have deterministic timing, which can be managed by memory controller 720 and used in determining how to schedule the transactions with scheduler 730.

Figure 8:
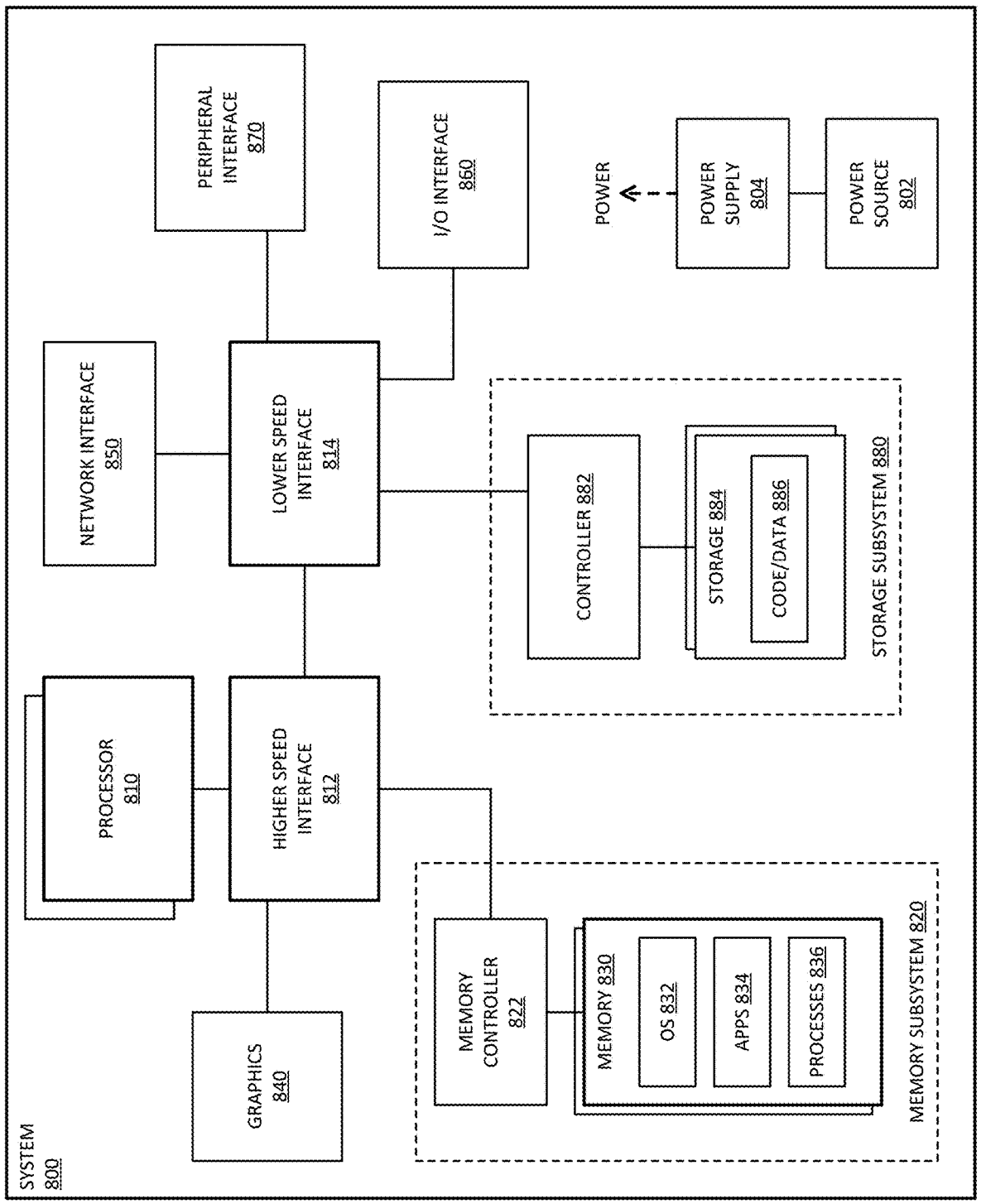
FIG. 8 is a block diagram of an example of a computing system in which a memory device with nitride-free vias can be implemented.

FIG. 8 is a block diagram of an example of a computing system in which a memory device with nitride-free vias can be implemented. System 800 represents a computing device in accordance with any example herein, and can be a laptop computer, a desktop computer, a tablet computer, a server, a gaming or entertainment control system, embedded computing device, or other electronic device.

In one example, system 800 includes memory 830, which has stacked memory in accordance with any example herein. The stacked memory cell structure includes a metal silicon nitride layer on a memory cell structure. The metal silicon nitride layer is on the memory array and is patterned with the crosspoint architecture, and is not on vias that provide a connection from the wordline or bitline to other circuitry. In one example, memory 830 represents a nonvolatile memory device. In one example, the stacked memory cell structure includes a layer of metal silicide.

System 800 includes processor 810 can include any type of microprocessor, central processing unit (CPU), graphics processing unit (GPU), processing core, or other processing hardware, or a combination, to provide processing or execution of instructions for system 800. Processor 810 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 800 includes interface 812 coupled to processor 810, which can represent a higher speed interface or a high throughput interface for system components that need higher bandwidth connections, such as memory subsystem 820 or graphics interface components 840. Interface 812 represents an interface circuit, which can be a standalone component or integrated onto a processor die. Interface 812 can be integrated as a circuit onto the processor die or integrated as a component on a system on a chip. Where present, graphics interface 840 interfaces to graphics components for providing a visual display to a user of system 800. Graphics interface 840 can be a standalone component or integrated onto the processor die or system on a chip. In one example, graphics interface 840 can drive a high definition (HD) display that provides an output to a user. In one example, the display can include a touchscreen display. In one example, graphics interface 840 generates a display based on data stored in memory 830 or based on operations executed by processor 810 or both.

Memory subsystem 820 represents the main memory of system 800, and provides storage for code to be executed by processor 810, or data values to be used in executing a routine. Memory subsystem 820 can include one or more memory devices 830 such as read-only memory (ROM), flash memory, one or more varieties of random access memory (RAM) such as DRAM, or other memory devices, or a combination of such devices. Memory 830 stores and hosts, among other things, operating system (OS) 832 to provide a software platform for execution of instructions in system 800. Additionally, applications 834 can execute on the software platform of OS 832 from memory 830. Applications 834 represent programs that have their own operational logic to perform execution of one or more functions. Processes 836 represent agents or routines that provide auxiliary functions to OS 832 or one or more applications 834 or a combination. OS 832, applications 834, and processes 836 provide software logic to provide functions for system 800. In one example, memory subsystem 820 includes memory controller 822, which is a memory controller to generate and issue commands to memory 830. It will be understood that memory controller 822 could be a physical part of processor 810 or a physical part of interface 812. For example, memory controller 822 can be an integrated memory controller, integrated onto a circuit with processor 810, such as integrated onto the processor die or a system on a chip.

While not specifically illustrated, it will be understood that system 800 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 800 includes interface 814, which can be coupled to interface 812. Interface 814 can be a lower speed interface than interface 812. In one example, interface 814 represents an interface circuit, which can include standalone components and integrated circuitry. In one example, multiple user interface components or peripheral components, or both, couple to interface 814. Network interface 850 provides system 800 the ability to communicate with remote devices (e.g., servers or other computing devices) over one or more networks. Network interface 850 can include an Ethernet adapter, wireless interconnection components, cellular network interconnection components, USB (universal serial bus), or other wired or wireless standards-based or proprietary interfaces. Network interface 850 can exchange data with a remote device, which can include sending data stored in memory or receiving data to be stored in memory.

In one example, system 800 includes one or more input/output (I/O) interface(s) 860. I/O interface 860 can include one or more interface components through which a user interacts with system 800 (e.g., audio, alphanumeric, tactile/touch, or other interfacing). Peripheral interface 870 can include any hardware interface not specifically mentioned above. Peripherals refer generally to devices that connect dependently to system 800. A dependent connection is one where system 800 provides the software platform or hardware platform or both on which operation executes, and with which a user interacts.

In one example, system 800 includes storage subsystem 880 to store data in a nonvolatile manner. In one example, in certain system implementations, at least certain components of storage 880 can overlap with components of memory subsystem 820. Storage subsystem 880 includes storage device(s) 884, which can be or include any conventional medium for storing large amounts of data in a nonvolatile manner, such as one or more magnetic, solid state, or optical based disks, or a combination. Storage 884 holds code or instructions and data 886 in a persistent state (i.e., the value is retained despite interruption of power to system 800). Storage 884 can be generically considered to be a "memory," although memory 830 is typically the executing or operating memory to provide instructions to processor 810. Whereas storage 884 is nonvolatile, memory 830 can include volatile memory (i.e., the value or state of the data is indeterminate if power is interrupted to system 800). In one example, storage subsystem 880 includes controller 882 to interface with storage 884. In one example controller 882 is a physical part of interface 814 or processor 810, or can include circuits or logic in both processor 810 and interface 814.

Power source 802 provides power to the components of system 800. More specifically, power source 802 typically interfaces to one or multiple power supplies 804 in system 802 to provide power to the components of system 800. In one example, power supply 804 includes an AC to DC (alternating current to direct current) adapter to plug into a wall outlet. Such AC power can be renewable energy (e.g., solar power) power source 802. In one example, power source 802 includes a DC power source, such as an external AC to DC converter. In one example, power source 802 or power supply 804 includes wireless charging hardware to charge via proximity to a charging field. In one example, power source 802 can include an internal battery or fuel cell source.

FIG. 9 is a block diagram of an example of a mobile device in which a memory system with a memory device with nitride-free vias can be implemented. Device 900 represents a mobile computing device, such as a computing tablet, a mobile phone or smartphone, wearable computing device, or other mobile device, or an embedded computing device. It will be understood that certain of the components are shown generally, and not all components of such a device are shown in device 900.

In one example, system 900 includes memory 962, which has stacked memory in accordance with any example herein. The stacked memory cell structure includes a metal silicon nitride layer on a memory cell structure. The metal silicon nitride layer is on the memory array and is patterned with the crosspoint architecture, and is not on vias that provide a connection from the wordline or bitline to other circuitry. In one example, memory 962 represents a nonvolatile memory device. In one example, the stacked memory cell structure includes a layer of metal silicide.

Device 900 includes processor 910, which performs the primary processing operations of device 900. Processor 910 can include one or more physical devices, such as microprocessors, application processors, microcontrollers, programmable logic devices, or other processing means. The processing operations performed by processor 910 include the execution of an operating platform or operating system on which applications and device functions are executed. The processing operations include operations related to I/O (input/output) with a human user or with other devices, operations related to power management, operations related to connecting device 900 to another device, or a combination. The processing operations can also include operations related to audio I/O, display I/O, or other interfacing, or a combination. Processor 910 can execute data stored in memory. Processor 910 can write or edit data stored in memory.

In one example, system 900 includes one or more sensors 912. Sensors 912 represent embedded sensors or interfaces to external sensors, or a combination. Sensors 912 enable system 900 to monitor or detect one or more conditions of an environment or a device in which system 900 is implemented. Sensors 912 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 912 can also include sensors for biometric systems such as fingerprint recognition systems, face detection or recognition systems, or other systems that detect or recognize user features. Sensors 912 should be understood broadly, and not limiting on the many different types of sensors that could be implemented with system 900. In one example, one or more sensors 912 couples to processor 910 via a frontend circuit integrated with processor 910. In one example, one or more sensors 912 couples to processor 910 via another component of system 900.

In one example, device 900 includes audio subsystem 920, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 900, or connected to device 900. In one example, a user interacts with device 900 by providing audio commands that are received and processed by processor 910.

Display subsystem 930 represents hardware (e.g., display devices) and software components (e.g., drivers) that provide a visual display for presentation to a user. In one example, the display includes tactile components or touchscreen elements for a user to interact with the computing device. Display subsystem 930 includes display interface 932, which includes the particular screen or hardware device used to provide a display to a user. In one example, display interface 932 includes logic separate from processor 910 (such as a graphics processor) to perform at least some processing related to the display. In one example, display subsystem 930 includes a touchscreen device that provides both output and input to a user. In one example, display subsystem 930 includes a high definition (HD) or ultra-high definition (UHD) display that provides an output to a user. In one example, display subsystem includes or drives a touchscreen display. In one example, display subsystem 930 generates display information based on data stored in memory or based on operations executed by processor 910 or both.

I/O controller 940 represents hardware devices and software components related to interaction with a user. I/O controller 940 can operate to manage hardware that is part of audio subsystem 920, or display subsystem 930, or both. Additionally, I/O controller 940 illustrates a connection point for additional devices that connect to device 900 through which a user might interact with the system. For example, devices that can be attached to device 900 might include microphone devices, speaker or stereo systems, video systems or other display device, keyboard or keypad devices, or other I/O devices for use with specific applications such as card readers or other devices.

As mentioned above, I/O controller 940 can interact with audio subsystem 920 or display subsystem 930 or both. For example, input through a microphone or other audio device can provide input or commands for one or more applications or functions of device 900. Additionally, audio output can be provided instead of or in addition to display output. In another example, if display subsystem includes a touchscreen, the display device also acts as an input device, which can be at least partially managed by I/O controller 940. There can also be additional buttons or switches on device 900 to provide I/O functions managed by I/O controller 940.

In one example, I/O controller 940 manages devices such as accelerometers, cameras, light sensors or other environmental sensors, gyroscopes, global positioning system (GPS), or other hardware that can be included in device 900, or sensors 912. The input can be part of direct user interaction, as well as providing environmental input to the system to influence its operations (such as filtering for noise, adjusting displays for brightness detection, applying a flash for a camera, or other features).

In one example, device 900 includes power management 950 that manages battery power usage, charging of the battery, and features related to power saving operation. Power management 950 manages power from power source 952, which provides power to the components of system 900. In one example, power source 952 includes an AC to DC (alternating current to direct current) adapter to plug into a wall outlet. Such AC power can be renewable energy (e.g., solar power, motion based power). In one example, power source 952 includes only DC power, which can be provided by a DC power source, such as an external AC to DC converter. In one example, power source 952 includes wireless charging hardware to charge via proximity to a charging field. In one example, power source 952 can include an internal battery or fuel cell source.

Memory subsystem 960 includes memory device(s) 962 for storing information in device 900. Memory subsystem 960 can include nonvolatile (state does not change if power to the memory device is interrupted) or volatile (state is indeterminate if power to the memory device is interrupted) memory devices, or a combination. Memory 960 can store application data, user data, music, photos, documents, or other data, as well as system data (whether long-term or temporary) related to the execution of the applications and functions of system 900. In one example, memory subsystem 960 includes memory controller 964 (which could also be considered part of the control of system 900, and could potentially be considered part of processor 910). Memory controller 964 includes a scheduler to generate and issue commands to control access to memory device 962.

Connectivity 970 includes hardware devices (e.g., wireless or wired connectors and communication hardware, or a combination of wired and wireless hardware) and software components (e.g., drivers, protocol stacks) to enable device 900 to communicate with external devices. The external device could be separate devices, such as other computing devices, wireless access points or base stations, as well as peripherals such as headsets, printers, or other devices. In one example, system 900 exchanges data with an external device for storage in memory or for display on a display device. The exchanged data can include data to be stored in memory, or data already stored in memory, to read, write, or edit data.

Connectivity 970 can include multiple different types of connectivity. To generalize, device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 974 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 980 include hardware interfaces and connectors, as well as software components (e.g., drivers, protocol stacks) to make peripheral connections. It will be understood that device 900 could both be a peripheral device ("to" 982) to other computing devices, as well as have peripheral devices ("from" 984) connected to it. Device 900 commonly has a "docking" connector to connect to other computing devices for purposes such as managing (e.g., downloading, uploading, changing, synchronizing) content on device 900. Additionally, a docking connector can allow device 900 to connect to certain peripherals that allow device 900 to control content output, for example, to audiovisual or other systems.

In addition to a proprietary docking connector or other proprietary connection hardware, device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example, an apparatus includes: a memory stack structure including multiple memory cells, the memory stack structure including a crosspoint architecture; a via in parallel with the memory stack structure to provide a current path to select at least one of the memory cells; a metal layer to couple to the via and to a top electrode of the memory stack structure; and a metal silicon nitride layer to couple the metal layer to the top electrode, wherein the metal silicon nitride layer to be part of the memory stack structure, to be between individual pillars of the crosspoint architecture and the metal layer, and not be between the metal layer and the via.

In general with respect to the descriptions herein, in one example, a system includes: a processor; and a nonvolatile memory device coupled to the processor, the nonvolatile memory device including: a memory array of stacked memory cells in vertical pillars in a crosspoint architecture; a via in parallel with the vertical pillars to provide a current path to select at least one of the memory cells; a metal layer to couple to the via and to a vertical pillar; and a metal silicon nitride layer between the vertical pillar and the metal layer to couple the metal layer to the vertical pillar, the metal silicon nitride layer present on the vertical pillar between the vertical pillar and the metal layer, and absent from the via.

In one example, the via is to provide a current path to a bitline. In one example, the via is to provide a current path to a wordline. In one example, the metal layer comprises tungsten (W) and the metal silicon nitride layer comprises tungsten silicon nitride (WSiN). In one example, the apparatus or system further includes a layer of tungsten silicide (WSix) as a seed layer for the tungsten metal layer. In one example, the memory stack structure further comprises a layer of carbon as the top electrode. In one example, the crosspoint architecture comprises a three dimensional (3D) crosspoint (3DXP) nonvolatile memory architecture. In one example, the system includes one or more of: wherein the processor comprises a multicore central processing unit (CPU); a display communicatively coupled to the processor; a battery to power the system; or a network interface communicatively coupled to the processor.

In general with respect to the descriptions herein, in one example, a method for creating a stacked memory device includes: forming a memory stack structure including multiple memory cells in vertical pillars in a crosspoint architecture, including forming a metal silicon nitride layer on the vertical pillars; creating a via parallel to the vertical pillars to provide a current path to select at least one of the memory cells; and forming a metal layer to couple to the via and to a vertical pillar, the metal silicon nitride layer present between the memory stack structure and the metal layer, and absent on the via.

In one example, creating the via comprises creating a current path to a bitline. In one example, creating the via comprises creating a current path to a wordline. In one example, forming the metal layer comprises depositing tungsten (W) and wherein forming the metal silicon nitride layer comprises depositing tungsten silicon nitride (WSiN). In one example, the method further includes forming a layer of tungsten silicide (WSix) as a seed layer for the tungsten metal layer. In one example, forming the memory stack structure comprises forming a layer of carbon as a top electrode between the metal layer and the metal silicon nitride layer. In one example, the method further includes: depositing the metal silicon nitride layer over the memory stack structure and the via; and subsequently, removing the metal silicon nitride layer from the via and maintaining the metal silicon nitride layer over the memory stack structure.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus comprising:
   a memory stack structure including multiple memory cells, the memory stack structure including a crosspoint architecture;
   a via in parallel with the memory stack structure to provide a current path to select at least one of the memory cells;
   a metal layer to couple to the via and to a top electrode of the memory stack structure; and
   a metal silicon nitride layer to couple the metal layer to the top electrode, wherein the metal silicon nitride layer to be part of the memory stack structure, to be between individual pillars of the crosspoint architecture and the metal layer, and not be between the metal layer and the via.

2. The apparatus of claim 1, wherein the via is to provide a current path to a bitline.

3. The apparatus of claim 1, wherein the via is to provide a current path to a wordline.

4. The apparatus of claim 1, wherein the metal layer comprises tungsten (W) and the metal silicon nitride layer comprises tungsten silicon nitride (WSiN).

5. The apparatus of claim 4, further comprising a layer of tungsten silicide (WSix) as a seed layer for the tungsten metal layer.

6. The apparatus of claim 1, wherein the memory stack structure further comprises a layer of carbon as the top electrode.

7. The apparatus of claim 1, wherein the crosspoint architecture comprises a three dimensional (3D) crosspoint (3DXP) nonvolatile memory architecture.

8. A system comprising:
   a processor; and
   a nonvolatile memory device coupled to the processor, the nonvolatile memory device including:
      a memory array of stacked memory cells in vertical pillars in a crosspoint architecture;
      a via in parallel with the vertical pillars to provide a current path to select at least one of the memory cells;
      a metal layer to couple to the via and to a vertical pillar; and
      a metal silicon nitride layer between the vertical pillar and the metal layer to couple the metal layer to the vertical pillar, the metal silicon nitride layer present on the vertical pillar between the vertical pillar and the metal layer, and absent from the via.

9. The system of claim 8, wherein the via is to provide a current path to a bitline or to a wordline.

10. The system of claim 8, wherein the metal layer comprises tungsten (W) and the metal silicon nitride layer comprises tungsten silicon nitride (WSiN); and
    further comprising a layer of tungsten silicide (WSix) as a seed layer for the tungsten metal layer.

11. The system of claim 8, wherein the memory array further comprises a layer of carbon as a top electrode of the vertical pillars.

12. The system of claim 8, wherein the crosspoint architecture comprises a three dimensional (3D) crosspoint (3DXP) nonvolatile memory architecture.

13. The system of claim 8, comprising one or more of:
    wherein the processor comprises a multicore central processing unit (CPU);
    a display communicatively coupled to the processor;
    a battery to power the system; or a network interface communicatively coupled to the processor.

14. A method for creating a stacked memory device, comprising:
    forming a memory stack structure including multiple memory cells in vertical pillars in a crosspoint architecture, including forming a metal silicon nitride layer on the vertical pillars;
    creating a via parallel to the vertical pillars to provide a current path to select at least one of the memory cells; and
    forming a metal layer to couple to the via and to a vertical pillar, the metal silicon nitride layer present between the memory stack structure and the metal layer, and absent on the via.

15. The method of claim 14, wherein creating the via comprises creating a current path to a bitline.

16. The method of claim 14, wherein creating the via comprises creating a current path to a wordline.

17. The method of claim 14, wherein forming the metal layer comprises depositing tungsten (W) and wherein forming the metal silicon nitride layer comprises depositing tungsten silicon nitride (WSiN).

18. The method of claim 17, further comprising forming a layer of tungsten silicide (WSix) as a seed layer for the tungsten metal layer.

19. The method of claim 14, wherein forming the memory stack structure comprises forming a layer of carbon as a top electrode between the metal layer and the metal silicon nitride layer.

20. The method of claim 14, further comprising:
    depositing the metal silicon nitride layer over the memory stack structure and the via; and subsequently,
    removing the metal silicon nitride layer from the via and maintaining the metal silicon nitride layer over the memory stack structure.

* * * * *